United States Patent [19]

Davis

[11] 4,093,466
[45] June 6, 1978

[54] ELECTROLESS TIN AND TIN-LEAD ALLOY PLATING BATHS

[75] Inventor: Thomas Francis Davis, Harrisburg, Pa.

[73] Assignee: AMP Incorporated, Harrisburg, Pa.

[21] Appl. No.: 574,979

[22] Filed: May 6, 1975

[51] Int. Cl.² .............................................. C23C 3/02
[52] U.S. Cl. .................................... 106/1.22; 427/437
[58] Field of Search ................ 106/1; 204/43 R, 43 S, 204/53, 54 R; 427/433, 437

[56] References Cited

U.S. PATENT DOCUMENTS

| | | | |
|---|---|---|---|
| 2,369,620 | 2/1945 | Sullivan et al. | 427/436 |
| 3,050,410 | 8/1962 | Greene | 106/1 |
| 3,303,029 | 2/1967 | Shipley | 106/1 |

Primary Examiner—Lorenzo B. Hayes
Attorney, Agent, or Firm—Gerald K. Kita

[57] ABSTRACT

Salt compositions and baths thereof useful in, and methods for, immersion plating of tin and tin-lead alloys which give greatly increased deposition rates and thicker coatings of better quality accomplished by incorporating into immersion plating tin bath compositions soluble plumbous salts in the amount of from 0.5 grams per liter calculated on the basis of elemental lead to the maximum amount soluble in the bath and a sulphur-containing complexing agent for the tin and lead such as thiourea or a thiourea-type derivative. Preferably the salt elements are stannous chloride, lead chloride, sodium hypophosphite (as a solubility enhancer) and with hydrochloric acid used as a agent for adjusting the pH in the resulting bath from 0.5 to 1.0.

6 Claims, No Drawings

ELECTROLESS TIN AND TIN-LEAD ALLOY PLATING BATHS

This invention relates to an immersion bath suitable for the deposition of essentially tin and of tin-lead alloys on copper, brass, other copper alloys and similar metal substrates (as discussed below). This invention also includes salt compositions useful in, and methods for, accomplishing the deposition of tin and tin-lead alloys by immersion plating. This invention, though not specifically so limited, finds particular usefulness in forming a protective and bondable (i.e., solder bondable) layer of tin over circuitry elements and in other electronic devices.

BACKGROUND OF THE INVENTION

There are three widely used methods for plating metal onto a substrate, and in some recent developments of plating circuitry on a non-conductive flexible plastic substrate all three may in fact be employed. These methods are (1) electroless plating, (2) immersion plating, and (3) electroplating. The choice of which method to employ for a given plating step is often controlled as much by the choice of the substrate or disadvantages of the respective methods as vis-a-vis the other methods. Although both methods (1) and (2) may be broadly characterized as electroless plating, this latter term as used hereinafter will be restricted to its narrower definition (involving reduction of the plating metal from the plating bath, as discussed below).

Some of the electroplating disadvantages are: a conductive path is required for the desired circuit pattern; due to uneven current densities, the "throwing power" of electrolytic baths can never reach the desired uniformity of deposit; e.g. with irregularly shaped substrates. The alkaline stannate electrolytic baths have greater throwing power than the acid stannous baths and require less critical control, but because these are restricted to the four valent stannate form these have a lower cathode efficiency.

Electrolytic deposits of tin are corrosion resistant and non-toxic, possess good solderability with good softness and ductility. However, to provide corrosion protection of a substantial nature the tin deposits should be thick enough to be virtually non-porous. Recommended thicknesses by the Tin Research Institute for plating of tin on copper is 0.5 mils both for soldering and for resisting atmospheric corrosion.

Tin, or even tin-lead alloys, are electrolytically deposited in thicknesses typically from 0.2 to 2.0 mils when used in printed and other circuitry to provide a solderable finish, a contact material, or an etchant resist. Tin can be readily deposited from acid solutions at room temperature. Where a lower melting point material is required, tin-lead alloys, such as the typical 60%-40% solder can also be deposited, but require much closer control of the solution composition and operating conditions, making it more costly (see *Printed and Integrated Circuitry*, Schlabach and Rider, McGraw-Hill Book Company, Inc., New York, 1963, at page 146).

Electroless plating involves the use of a plating bath without the imposition of any electric current where the substrate is plated by reduction of the plating metal from a solution of a salt of a plating metal. The plating solution contains controlled reducing agents which are generally either catalyzed by the surface of the substrate, or by some catalytic metal emplaced onto the surface both to initiate the reduction and to give good adherence. Since the plated-on surface is autocatalytic, an electroless process can be used to build up good thicknesses. Furthermore since an electroless process is not dependent upon current densitites, the resulting coating is of excellent uniformity.

However, reducing agents in electroless baths must be controlled in order to avoid spontaneous reduction of the metal in the bath e.g. to a fine powder. The reduction is not localized at the surface of the substrate, hence considerable losses may occur. Moreover, with copper-based substrates the electroless tin baths are affected adversely by contaminants such as cyanides, lead, zinc, manganese, and cadmium (see *Metals Handbook*, Vol. 2., p. 642; copyright 1964; American Society for Metals).

Immersion plating, like electroless plating does not employ an electric current. Immersion plating, sometines called galvanic plating, is an electrochemical displacement reaction which depends on the position that the substrate metal occupies in the electromotive series with respect to the metal to be deposited from solution. Plating occurs when the metal from a dissolved metal salt is displaced by a more active (less noble) metal that is immersed in the solution. This requirement indicates one limitation to the process, since in the standard electromotive series test conditions, copper is more noble than tin and under those conditions could not be placed by an immersion process to give a tin plate coating. However under acidic conditions, the relative electrode potentials reverse making the utilization of this process possible.

Major limitations of immersion plating in the past have been in the slow plating speeds and limited thicknesses. Immersion plating is generally self limiting, because as the plating coating builds up it tends to mask the underlying base metal thereby preventing further replacement; additionally as the displaced base metal is dissolved into the solution, it becomes an increasing contaminent in the bath progressively slowing the rate of displacement. Normal deposit thickness from immersion tin processes of the prior art is 50 to 100 microinches (i.e., 0.05 – 0.1 mils), mainly because of the foregoing problems in building the deposit to greater thicknesses.

An advantage of the immersion processes over many of the other aforementioned processes is the absence of hydrogen generation (or other gases) on the plating surface, thereby avoiding pitting or similar plating discontinuties. Also the immersion plating process is not subject to the surface roughness found in electroplating due to "drag-over" from precleaners, anode corrosion, and the like.

In comparison to electroless baths, there is no problem with the bath decomposing. With immersion plating, the circuit need not be electrically continuous nor need it have electrical contacts attached. There is no need for maintaining a precise current and the deposit is uniform in thickness. However in spite of these latter advantages, the prior art generally dismissed such immersion plating process for use with printed circuitry because it was noted that deposition of the more noble metal continued only in the presence of exposed base metal so that such deposits were "limited in thickness, porous, and often poorly adherent" and therefore of "limited interest" (see *Printed and Integrated Circuitry*, supra, at page 138).

Tin and some solders are subject under certain conditions to growth from their surfaces of metallic filaments known as "whiskers." These dendritic formations can in time and under proper conditions project from the surface to a length (as much as one-fourth of an inch) sufficient to short out adjacent circuitry when used for fine resolution electronic application printed circuits. The growth rate is encouraged slightly by elevated temperature and humidity, but is greatly promoted by high stresses (causing growth in a matter of hours). Such high stresses occur in thin tin or solder coatings (less than about 100 microinches) and will be higher in electrodeposited coatings because of the stresses which are impressed by the flow of current, not present in the electroless and immersion coating methods. As the prior art immersion coating method for depositing tin on copper are self limiting generally at a thickness of below 100 microinches, to a maximum limited to approximately 200 microinches; tin plating from the prior art immersion methods can be particularly susceptible to whisker growth not just in the original formation but in subsequent use.

Applicant has been unable to find any immersion process for plating a tin-lead alloy in the literature, and is aware of only one system, recently available on the market (a fluoroborate and immersion process) which codeposits any lead, and that only less than 1% (at 20–30 microinches of the tin maximum in 20 minutes at an operating range of 125°–150° F). The lead present in the latter system appears to have no effect on the rate of deposit and is intended solely to give a cosmetic effect.

The self limiting feature of prior art immersion tin plating procedures also made it more difficult to solder the resulting tin plating because of its limited thickness.

From the foregoing it can be appreciated that due to various disadvantages inherent in electroplating and electroless plating, immersion plating would for a great many applications be a more desirable method if a greater plating rate could be achieved and if a thicker final plating coating were possible, all with reduced whisker growth. Therefore objects of the present invention include methods and baths for immersion plating which overcome or minimize by a great order of magnitude each of these aforementioned limitations. More specifically, an object of the present invention is a novel method giving a faster rate of immersion plating so as to be more competitive with the other types of plating methods. A further object is with an immersion plating method giving essentially tin or tin-lead alloys of commercially useful thickness of the order of magnitude including 0.5 mils.

DESCRIPTION OF THE INVENTION

In accordance with the present invention, it has now been discovered that by including lead salts in an immersion tin plating bath, and an appropriate combination of cooperating elements the rate of deposition of tin can be increased by up to 500% in an immersion plating process. Furthermore, unlike electroplating processes, this increased rate of deposition has been achieved without promoting whisker growth; and, in fact, the small amount of lead present in the resulting tin plate appears to inhibit such whisker growth. Additionally, the tin immersion plating baths prepared according to the present invention result in a thicker coating of tin being plated than was readily achieved by the prior art immersion-type processes. (Even faster plating rates giving thicker plating can be achieved for tin-lead alloy, equally preferred in this invention).

Thus the immersion process of the present invention results in a more protective and more readily bondable layer of tin being plated to metallic copper, and in a significantly shorter time.

In the following Table is set forth a bath illustrating a preferred embodiment of the present invention for plating essentially tin at greatly enhanced plating rates.

TABLE I

TIN IMMERSION PLATING BATH

| Solution Make Up | Primary Range Grams/Liter | Extended Range Grams/Liter |
|---|---|---|
| a. Stannous Chloride ($SnCl_2$), hydrous | 20 – 40 | 10 – 150 |
| b. Lead Chloride ($PbCl_2$) | 2 – 15 | 1 – 12 |
| c. Sodium Hypophosphite ($NaH_2PO_2 \cdot H_2O$) | 10 – 100 | 10 – 100 |
| d. Thiourea ($NH_2 \cdot CS \cdot NH_2$) | 40 – 100 | 15 – 100 |
| e. Hydrochloric Acid (HCl) | 40 – 100 | 40 – 100 (ml/l) |
| f. Gelatin | 1.0 – 4.0 | 0.1 – 10 |

Extended operating range: 100 – 200° F

Extended operating range: 100 - 200° F

Items c, d and e may be individually substantially in excess of 100 g/l, if the other two are lower; otherwise lead tends to plate out at percentages in excess of 2%.

The above disclosed baths have been used to deposit 175 microinches of tin on metallic copper in 5 minutes in an operating temperature range of 140° to 180° F. The maximum rate of deposit so far attained is 100 microinches in one minute. The amount of lead deposited with the tin in these first baths typically ranges from above 0 to about 2% and in the specific preferred embodiments was less than one percent. This is a deposition rate of at least 500% faster than is known in prior art baths such as disclosed in the Shipley U.S. Pat. No. 3,303,029, issued Feb. 7, 1967; e.g. a bath of Example I thereof containing $SnCl_2$ (20 g/l), thiourea (75 g/l), $NaH_2PO_2 \cdot H_2O$ (16 g/l), wetting agent (1 g/l), and HCl (conc.) (50 ml/l), with an operating temperature of 150°–180° F giving a rate of deposit of 53 microinches in 5 minutes; 95 microinches in 10 minutes; 132 microinches in 30 minutes; and 189 microinches in 60 minutes. Immersion plating baths of the present invention having lead salts added have already achieved a plating rate of up to 300 microinches in 5 minutes.

The bath has been adjusted by HCl to a strongly acidic condition in order to permit the immersion plating of tin on copper. In the illustrated embodiment the pH is about 1. The presence of lead in the bath eliminates the use of sulfuric acid because of the formation of insoluble lead sulfate. Since the bath is a hydrochloric acid based bath, the lead and tin should preferably be introduced as chlorides to prevent the buildup of other ions in the bath. Other soluble salts could be used; and as yet, no long term adverse effects on this system are known. The lead and tin oxides could also be used, since they would be converted to the chlorides by the hydrochloric acid. Other non-precipitating strong acids in this system are indicated; such as hydrobromic acid, etc. The sodium hypophosphite makes the tin chloride more soluble in the water bath, probably assists the HCl in keeping the tin ion in the stannous state (since immersion plating will not proceed from the stannic state), and permits the immersion plating to proceed at a lower temperature. Thiourea functions as a complexing agent for the stannous and plumbous chlorides. Other complexing agents (preferably non-toxic) that form chelates with both metals (especially when bound through a sulfur atom) could be substituted (including thiourea derivatives such as tetramethyl thiourea). Gelatin is added as a surfactant giving a smoother deposition (leveling effect). Other suitable surfactants, soluble and stable in this system could be substituted. For example recent tests have shown GAF's IGEPAL (trademark), i.e., alkylphenoxypoly (oxyethylene) ethanols, are even better than gelatin in these systems as grain refiners.

The tin and lead should both be added in the plumbous and stannous state. The percentages of each is determined by the total concentration of the system and the operating temperature. An increase in temperature increases the rate of deposit, and an increase in the concentration of lead with respect to the concentration of tin will increase the rate of deposit. Thus it will be appreciated that the percentage of lead in the deposit will depend on the particular bath used.

Traces of lead in the foregoing bath increases not only the immersion plating rate of tin on copper, but also the ultimate thickness achieved. In a comparison of the typical prior art bath set forth above with a bath prepared according to the present invention as set forth in Table I, the maximum practical plating thickness which could be achieved by the former was about 100 microinches and took nearly 30 minutes to form. In contrast the bath in Table I plated 175 microinches in only 5 minutes.

As indicated earlier an equally important aspect of the present invention is its use in plating solder and other tin-lead alloys of thicknesses up to ½ mil by immersion techniques, and consequently with more uniform plating and at less expense than the heretofore accepted standard prior art electroplating techniques.

Table II below is an example of a bath according to another preferred embodiment of the present invention, specifically adapted for depositing a tin-lead solder (60-40). It will be noted that as the percentage of lead significantly increases the percentage molar ratio of tin to lead in the bath becomes close to the ratio of the metal content of the alloy plated. Baths of this type have successfully plated alloys of up to 95% lead content.

TABLE II

| | |
|---|---|
| $PbCl_2$ | 8.05 g/l |
| $SnCl_2 . 2 H_2O$ | 16.35 g/l |
| $NaH_2PO_2 . 2 H_2O$ | 80 g/l |
| Thiourea | 150 g/l |
| HCL Cl | 80 ml/l |

Operating temperature — 170° F
Rate of deposition — 200 microinches in 5 minutes
Rate of deposition — 300 microinches in 10 minutes Immersion baths capable of plating tin-lead alloys containing percentages of tin in excess of approximately 2% apparently are heretofore unknown in the literature. As illustrated in Table II it has been discovered that these baths can not only incorporate plumbous salts as rate of deposit enhancers in immersion tin plating, but in fact can be adjusted to give tin-lead alloys of any desired ratio, (a surprising development).

It has been found that within the 20 to 80% range the percentages of the lead and tin in the baths closely follow the percentages actually plated out in the resulting alloys. Outside this range the linear relationship no longer holds true and proportionally more of the metal which is in greater concentration plates out than would be indicated by the percentage composition of the bath.

It should also be noted that for all ratios of tin to lead the preferable total lead plus tin content of the bath is 30 and 40 grams per liter. Because of the greater solubility of stannous chloride, wider variation from this is possible in the lower lead content alloys than otherwise; nevertheless, even with the latter alloys the preferred baths are close to the 30 to 40 gram per liter range.

Baths for plating alloys having 90 to 95% lead will have bath concentrations of 15 to 25 grams per liter of lead chloride and 6 to 10 grams per liter of tin chloride dihydrate. In order to plate 60 - 40 tin—lead solder the preferred ratios are 15 to 25 grams per liter of tin chloride dihydrate and 8 to 12 grams per liter of lead chloride. In order to plate an alloy having 10% lead - 90% tin, the bath should preferably have 6 grams per liter of lead chloride and 25 grams per liter of tin chloride dihydrate. Note that lead chloride is not soluble at concentrations in these baths in excess of approximately 25 grams per liter.

For these latter baths, the other ingredients should have concentrations of 60–100 grams per liter of sodium hyposulfite; 100–150 grams per liter of thiourea and 50–100 milliliters per liter of hydrochloric acid. Concentrations above the latter ranges are permissible but serve no useful purpose and therefore are uneconomical.

The preferred pH range for all of these baths are from about 0.5 to about 1.0.

As obtained from the above baths, the plated-on deposit was tested by a Scotch tape adhesion test and very good adhesion was confirmed. Similarly the solder wettability of the tin plating was found to be excellent.

The substrates on which this bath can be used to plate tin or tin-lead alloys include metallic copper, copper alloys (in all their various forms, including printed circuits which have been built up upon organic dielectrics such as a flexible support of a polyimide, Mylar, polyolefins, and such as rigid boards of impregnated fiberglass, epoxy and the like), lead, and any such other metals displaceable with tin or tin and lead from a thiourea-type complex. The improved printed circuit for example could involve a flexible polyimide tape which has its surface selectively activated by palladium and a thin film of copper deposited thereon in the printed circuit pattern by an electroless process which electroless copper plating has been further built up by the electrolytic deposition from copper strike; which in turn has been still further built up, if necessary, by conventional electrolytic depositions. Finally the copper printed circuitry is coated with a protective bondable layer of tin or tin-lead alloy according to the present invention.

The copper parts to be plated should be cleaned first, by any normal cleaning method. Sulfuric acid and persulfate should be avoided, however, to prevent the drag-in of any sulfates.

Note that the invention in its broader aspects includes baths substantially the same as the specifically disclosed preferred embodiments, but which omit sodium hypophosphite altogether. Such baths are not preferred because the solubility of the bath will be decreased requiring higher temperatures and/or lower concentrations (with possibly some slight modification of the ratio of the remaining components—as will be understood by those skilled in the art having benefit of the disclosure herein).

There is no specific preferred concentration or makeup of the bath. That depends on the operating temperature, rate of deposit, and percentage of lead desired. However, the following baths are further illustrative of the present invention:

TABLE III

| | |
|---|---|
| Sn Cl$_2$ . 2 H$_2$O | 21.8 gm/l |
| PbCl$_2$ | 11.0 gm/l |
| Thiourea | 80 gm/l |
| HCl (conc.) | 50 ml/l |
| NaH$_2$PO$_2$ | 16 gm/l |
| With 1 g/l gelatin | |

Operating temperature — 160 - 180° F
Thickness — 2 min. at 170° F — 120 microinches
Thickness — 5 min. at 170° F — 175 microinches
Deposits tin in excess of 98%

TABLE IV

| | |
|---|---|
| SnCl$_2$ . 2 H$_2$O | 20 g/l |
| PbCl$_2$ | 4 g/l |
| Thiourea | 100 g/l |
| HCl | 80 ml/l |
| NaH$_2$PO$_2$ | 90 g/l |
| With 1 g/l gelatin | |

Operating temperature — 140 - 180° F
Thickness — 5 min. at 170° F — 85 microinches
Thickness — 5 min. at 140° F — 55 microinches
Deposits tin in excess of 98%

TABLE V

| | |
|---|---|
| SnCl$_2$ . 2 H$_2$O | 20 g/l |
| PbCl$_2$ | 6 g/l |
| Thiourea | 120 g/l |
| HCl | 90 ml/l |
| NaH$_2$PO$_2$ H$_2$O | 100 g/l |
| Gelatin | 1 g/l |

Operating temperature — 140 - 180° F
Thickness — 5 min. at 140° F — 28 microinches
Thickness — 5 min. at 170° F — 135 microinches
Deposits tin in excess of 98%

TABLE VI

| | |
|---|---|
| SnCl$_2$ . 2 H$_2$O | 10 g/l |
| PbCl$_2$ | 15 g/l |
| Thiourea | 100 g/l |
| HCl | 80 ml/l |
| NaH$_2$PO$_2$ | 60 g/l |

Operating temperature — 170 - 180° F
Thickness — 5 min. — 300 microinches

TABLE VI-continued

Deposits: 90% lead — 10% tin

I claim:

1. A salt composition, when diluted with 1 liter of water and sufficient hydrochloric acid to provide a solution having a pH of 0.5 to 1, is suitable for immersion plating of tin-lead alloys at increased rates, the salt composition comprising the proportions of:

| | | |
|---|---|---|
| a. | hydrous stannous chloride (SnCl$_2$ . 2H$_2$O) | from about 10 to about 150 g, |
| b. | lead chloride (PbCl$_2$) | from about 1 to about 12 g, |
| c. | sodium hypophosphite (NaH$_2$PO$_2$ . H$_2$O) | from about 10 to about 100 g, and |
| d. | thiourea (NH$_2$ . CS . NH$_2$) | from about 15 to about 100 g, |

2. A salt composition for immersion plating a tin-lead alloy, when diluted with 1 liter of water and sufficient hydrochloric acid to provide a solution having a pH of 0.5 to 1, said salt composition comprising the proportions of:

| | | |
|---|---|---|
| a. | hydrous stannous chloride (SnCl$_2$ . 2H$_2$O) | from about 5 to about 100 g, |
| b. | lead chloride (PbCl$_2$) | from about 2 to about 25 g, |
| c. | sodium hypophosphite (NaH$_2$PO$_2$ . H$_2$O) | from about 60 to about 100 g, and |
| d. | thiourea (NH$_2$ . CS . NH$_2$) | from about 100 to about 150 g. |

3. A composition according to claim 1 further comprising gelatin from about 0.1 g.

4. A composition according to claim 1 further comprising an alkylphenoxy polyethanol surfactant from about 0.1 g.

5. A composition according to claim 2 further comprising gelatin from about 0.1 g.

6. A composition according to claim 2 further comprising an alkylphenoxy polyethanol surfactant from about 0.1 g.

* * * * *